United States Patent
Hefner et al.

(10) Patent No.: US 8,546,874 B2
(45) Date of Patent: Oct. 1, 2013

(54) POWER SWITCHING SEMICONDUCTOR DEVICES INCLUDING RECTIFYING JUNCTION-SHUNTS

(75) Inventors: Allen Hefner, Darnestown, MD (US); Sei-Hyung Ryu, Cary, NC (US); Anant Agarwal, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/267,966

(22) Filed: Oct. 7, 2011

(65) Prior Publication Data

US 2012/0068263 A1    Mar. 22, 2012

Related U.S. Application Data

(60) Continuation of application No. 12/560,729, filed on Sep. 16, 2009, now Pat. No. 8,034,688, which is a division of application No. 11/556,448, filed on Nov. 3, 2006, now Pat. No. 7,598,567.

(51) Int. Cl.
*H01L 29/76* (2006.01)

(52) U.S. Cl.
USPC ............ 257/328; 257/502; 257/E29.189

(58) Field of Classification Search
USPC .......... 257/291, 328, 502, 341, 498, E29.256, 257/E21.417, E29.332, E21.058, E21.066, 257/E29.066
See application file for complete search history.

(56) References Cited

U.S. PATENT DOCUMENTS

| | | | |
|---|---|---|---|
| 5,506,421 A | 4/1996 | Palmour | |
| 6,104,043 A | 8/2000 | Hermansson et al. | |
| 6,459,108 B1 | 10/2002 | Bartsch et al. | |
| 6,524,900 B2 | 2/2003 | Dahlqvist et al. | |
| 6,573,534 B1 * | 6/2003 | Kumar et al. | 257/77 |
| 6,956,238 B2 | 10/2005 | Ryu et al. | |
| 6,965,146 B1 | 11/2005 | Wu | |
| 7,060,572 B2 | 6/2006 | Jang | |
| 7,235,841 B2 | 6/2007 | Onishi et al. | |
| 7,598,567 B2 | 10/2009 | Hefner et al. | |

(Continued)

FOREIGN PATENT DOCUMENTS

| | | |
|---|---|---|
| EP | 1 814 162 A1 | 8/2007 |
| JP | 2006-086549 A | 3/2006 |

(Continued)

OTHER PUBLICATIONS

"Power MOSFET" Wikipedia.com Aug. 9, 2006 (9 pages).
Baliga. "Power MOSFET" *Power Semiconductor Devices*. PWS Publishing Company, Boston, MA. pp. 335-425 (1996).

(Continued)

*Primary Examiner* — Selim Ahmed
(74) *Attorney, Agent, or Firm* — Myers Bigel Sibley & Sajovec, P.A.

(57) ABSTRACT

A semiconductor device includes a drift layer and a body region that forms a p-n junction with the drift layer. A contactor region is in the body region, and a shunt channel region extends through the body region from the contactor region to the drift layer. The shunt channel region has a length, thickness and doping concentration selected such that: 1) the shunt channel region is fully depleted when zero voltage is applied across the first and second terminals, 2) the shunt channel becomes conductive at a voltages less than the built-in potential of the drift layer to body region p-n junction, and/or 3) the shunt channel is not conductive for voltages that reverse bias the p-n junction between the drift region and the body region.

21 Claims, 12 Drawing Sheets

(56) References Cited

U.S. PATENT DOCUMENTS 8,034,688 B2 10/2011 Hefner et al.
2002/0167082 A1 11/2002 Weber et al.
2004/0211980 A1* 10/2004 Ryu ............................. 257/200

FOREIGN PATENT DOCUMENTS

| JP | 2006086549 | * | 3/2006 |
| WO | WO 2004/084310 | | 9/2004 |
| WO | WO 2006/054394 | | 5/2006 |

OTHER PUBLICATIONS

International Search Report and Written Opinion for corresponding International Application No. PCT/US2007/023179 mailed May 9, 2008 (12 pages).
Supplemental European Search Result for EP Application No. 07 86 1662 dated Apr. 16, 2010.
Translation of Japanese Office Action for JP2009-536257, dated Feb. 15, 2012.

\* cited by examiner

POWER SWITCHING SEMICONDUCTOR DEVICES INCLUDING RECTIFYING JUNCTION-SHUNTS

CLAIM OF PRIORITY

The present application is a continuation of U.S. patent application Ser. No. 12/560,729, filed Sep. 16, 2009, now U.S. Pat. No. 8,034,688 which is a divisional of and claims priority from U.S. patent application Ser. No. 11/556,448, filed Nov. 3, 2006, now U.S. Pat. No. 7,598,567 entitled "POWER SWITCHING SEMICONDUCTOR DEVICES INCLUDING RECTIFYING JUNCTION-SHUNTS," which is assigned to the assignees of the present application, the disclosures of which are hereby incorporated herein by reference as if set forth fully.

STATEMENT OF GOVERNMENT INTEREST

The present invention was made, at least in part, with support from Office of Naval Research contract number 05-C-0202. The Government has certain rights in this invention.

FIELD OF THE INVENTION

This invention relates to power semiconductor devices and methods of forming power semiconductor devices, and more particularly to power switching semiconductor devices and methods of forming power switching semiconductor devices.

BACKGROUND

Power semiconductor devices are widely used to carry large currents and support high voltages. One widely used power device is the power Metal Oxide Semiconductor Field Effect Transistor (MOSFET). In a power MOSFET, a control signal is supplied to a gate electrode that is separated from a semiconductor surface by an intervening insulator, which may be, but is not limited to, silicon dioxide. Current conduction occurs via transport of majority carriers, without the presence of minority carrier injection that is used in bipolar transistor operation. Power MOSFETs can provide an excellent safe operating area, and can be paralleled in a unit cell structure.

As is well known to those having skill in the art, MOSFET devices may generally have a lateral structure or a vertical structure. In a lateral structure, the drain, gate and source terminals are on the same surface of a substrate. In contrast, in a vertical structure, the source and drain are on opposite surfaces of the substrate.

Although most power devices are formed in silicon, recent development efforts have also included investigation of the use of silicon carbide (SiC) for power devices. Silicon carbide has a combination of electrical and physical properties that make it an attractive semiconductor material for high temperature, high voltage, high frequency and/or high power electronic devices. These properties include a 3.0 eV bandgap, a 4 MV/cm electric field breakdown, a 4.9 W/cm-K thermal conductivity, and a $2.0 \times 10^7$ cm/s electron drift velocity.

These properties may allow silicon carbide power devices to operate at higher temperatures, higher power levels and/or with lower specific on-resistance than conventional silicon-based power devices. A power MOSFET fabricated in silicon carbide is described in U.S. Pat. No. 5,506,421 to Palmour entitled "Power MOSFET in Silicon Carbide" and assigned to the assignee of the present invention.

A conventional vertical power MOSFET structure 10 is illustrated in FIG. 1. The structure includes an n+ substrate 22 on which an n-drift layer 24 is formed. P-type body regions 16 are formed in the n-drift layer by, for example, ion implantation. N-type source regions 20 are formed in the body regions 16 adjacent p+ body contact regions 18. A gate insulator 28 is formed on the surface of the drift layer 24 and extends over the surface of the body regions 16 between the source regions 20 and the drift layer 24. A gate contact 26 is formed on the gate insulator 28. Source contacts 30 are formed on the source regions 20, while a drain contact 32 is formed on the substrate 22. When a sufficient voltage is applied to the gate contact 26, a channel is induced at the surface of the device 10 in the body regions 16 between the source regions 20 and the drain region 24, placing the device in an ON-state.

In the OFF state (i.e. when a gate voltage sufficient to induce a channel is not present), the power MOSFET structure 10 is equivalent to a PIN diode formed by the p+ body region 16, the n-type drift layer 24 and the n+ substrate 22. When this structure is reverse-biased, a depletion region extends principally on the drift layer side of the junction J1 between the body region 16 and the drift layer 24 towards the substrate 22, blocking the drain voltage.

However, when the device 10 is in the ON state, the drift layer 24 provides a conduction path between the source 20 and the substrate 22. Thus, the resistance of the drift layer 24 contributes to the drain-to-source resistance RDSon of the device 10.

The doping level and the thickness of the n-drift layer 24 affect both the breakdown voltage and the RDSon of the transistor device 10. The thicker the drift layer 24 and the lower its doping level, the higher the breakdown voltage of the device 10. Conversely, the thinner the drift layer 24 and the higher its doping level, the lower the RDSon (and therefore the lower the conduction losses of the device 10). Therefore, there is a trade-off between the voltage rating of a power MOSFET device and its ON-state resistance.

Typical applications for switching power devices, such as insulated gate bipolar transistors (IGBTs) and/or power MOSFETs, may benefit from reverse conduction for rectification and/or clamping by an internal and/or external diode. Because power MOSFETs have an inherent PIN diode within the structure, this internal diode may be utilized for rectification and clamping, or may be bypassed by an external diode. Because the inherent internal PIN diode of a power MOSFET may cause minority carrier injection across the drain-body junction J1, the device may have a slow reverse recovery time due to minority carrier recombination. Furthermore, injection of minority carriers across the drain-body junction J1 may contribute to degradation of the SiC crystal forming the drift layer 24.

Power switching semiconductor devices also include high voltage silicon carbide Schottky diodes and PIN diodes, which may have voltage blocking ratings between, for example, about 600V and about 10 kV or more. Such diodes may handle as much as about 100 A or more of forward current, depending on their active area design.

PIN devices, which are minority carrier devices, typically exhibit relatively poor switching speeds. In contrast, Schottky devices are theoretically capable of much higher switching speeds. In addition, silicon carbide devices may be capable of handling a higher current density than silicon devices.

A conventional SiC Schottky diode structure has an n-type SiC substrate on which an n– epitaxial layer, which functions as a drift region, is formed. The device typically includes a Schottky contact formed directly on the n-layer. A junction termination region, such as a guard ring and/or p-type JTE (junction termination extension) region, is typically formed to surround the Schottky junction active region. The purpose of junction termination region is to reduce or prevent electric field crowding at the edges of the Schottky junction, and to hinder the depletion region from interacting with the surface of the device. Surface effects may cause the depletion region to spread unevenly, which may adversely affect the breakdown voltage of the device.

Regardless of the type of termination used, the Schottky diode will break down if a large enough reverse voltage is applied to the junction. Such break downs are generally catastrophic, and may damage or destroy the device. Furthermore, even before the junction has failed, a Schottky diode may experience large reverse leakage currents. In order to reduce such leakage currents, the junction barrier Schottky (JBS) diode was developed. JBS diodes are sometimes referred to as Merged PIN-Schottky (MPS) diodes to reflect the possible mode of operation including minority carrier injection from the inherent PiN diode within the JBS structure.

A conventional JBS diode 50 is illustrated in FIG. 2. As shown therein, a conventional JBS diode 50 includes an n-type substrate 52 on which an n-drift layer 54 is formed. A plurality of p+ regions 56 are formed, typically by ion implantation, in the surface of the n-drift layer 54. A metal anode contact 58 is formed on the surface of the n-drift layer 54 in contact with both the n-drift layer 54 and the p+ regions 56. The anode contact 58 forms a Schottky junction with the exposed portions of the drift layer 54 between the p+ regions 56, and may form an ohmic contact with the p+ regions 56. A cathode contact 60 is formed on the substrate 52. Silicon carbide-based JBS diodes are described, for example, in U.S. Pat. Nos. 6,104,043 and 6,524,900.

In forward operation, the junction J3 between the anode contact 58 and the drift layer 54 turns on at lower voltages than the junction J2 between the p+ regions 56 and the drift layer 54. Thus, at low forward voltages, the device exhibits Schottky diode behavior. That is, current transport in the device is dominated by majority carriers (electrons) injected across the Schottky junction J3 at low forward voltages. As there may be no minority carrier injection (and thus no minority charge storage) in the device at normal operating voltages, JBS diodes may have fast switching speeds characteristic of Schottky diodes.

Under reverse bias conditions, however, the depletion regions formed by the PN junctions J2 between the p+ regions 56 and the drift layer 54 expand to block reverse current through the device 50, protecting the Schottky junction J3 and limiting reverse leakage current in the device 50. Thus, in reverse bias, the JBS diode 50 approaches the voltage blocking behavior of a PIN diode. The voltage blocking ability of the device 50 is typically determined by the thickness and doping of the drift layer 54 and the design of the edge termination.

SUMMARY

A semiconductor device according to some embodiments of the invention includes a drift layer having a first conductivity type and a first body region adjacent the drift layer. The first body region may have a second conductivity type opposite the first conductivity type and may form a p-n junction with the drift layer. A second body region having the second conductivity type is on the first body layer. The device further includes a first contactor region in the body region and having the first conductivity type, and a shunt channel region extending between the first and second body regions from the contactor region to the drift layer. The shunt channel region may have the first conductivity type. The device further includes a first terminal in electrical contact with the first and second body regions and the first contactor region, and a second terminal in electrical contact with the drift layer.

The shunt channel region may have a length, thickness and doping concentration selected such that the channel region is fully depleted when zero voltage is applied across the first and second terminals. In particular, the channel region may have a doping concentration of from about 1E15 to about 5E17 cm$^{-3}$ and may have a thickness of about 0.05 µm to about 1 µm.

In some embodiments, the length, thickness and doping concentration of the shunt channel region may be selected such that the shunt channel region is not conductive when the p-n junction between the first body region and the drift layer is reverse biased.

The length, thickness and doping concentration of the shunt channel region and the doping concentration of the first and second body regions may be selected such that a conductive channel is formed in the shunt channel region when a voltage is applied to the first terminal that is less than a built-in potential of the p-n junction between the body region and the drift layer. The first and second body regions may have a doping concentration of from about 1E16 to about 1E20 cm$^{-3}$.

The semiconductor device may further include a substrate having the first conductivity type and having a dopant concentration greater than a dopant concentration of the drift layer, the drift layer is on the substrate and the second terminal is on the substrate.

The body region may include an implanted region in the drift layer, and the shunt channel region may include an epitaxial layer on the drift layer and first body region. The second body region may include an epitaxial layer on the shunt channel region. The contactor region may extend through the second body region and into the first body region.

The contactor region may include a first contactor region, and the semiconductor device may further include a second contactor region having the second conductivity type and extending through the first contactor region into the first body region.

The first terminal may be in electrical contact with the second contactor region.

In some embodiments, the first conductivity type may be n-type and the second conductivity type may be p-type. In other embodiments, the first conductivity type may be p-type and the second conductivity type may be n-type.

The first terminal may include an anode terminal and the second terminal may include a cathode terminal for the case where the first conductivity type is n-type and the terminals are reversed for the case where the first conductivity type is p-type.

The semiconductor device may further include a gate insulator layer on a surface of the second body region between the contactor region and the drift layer, and a gate contact on the gate insulator layer. The first terminal may include a source terminal, and the second terminal may include a drain terminal. The second body region may be in electrical contact with first terminal and/or in electrical contact with second contactor in regions where the first contactor is masked.

The semiconductor device may further include a threshold adjustment layer on the second body region. The threshold adjustment layer may have a doping concentration selected to adjust a threshold voltage of the semiconductor device.

The semiconductor device may further include a neck implant region adjacent the first and second body regions. The neck implant region may have the first conductivity type, and the shunt channel region may extend between the contactor region and the neck implant region.

The contactor region may include a vertical contactor region extending from a surface of the semiconductor device into the first body region and a horizontal contactor region in contact with the vertical contactor region and extending from the vertical contactor region to the shunt channel region.

The semiconductor device may further include a recess within the second body region and a conductive material in the recess, and the contactor region may include a horizontal contactor region in contact with the conductive material within the recess and extending from the recess to the channel region.

Some embodiments of the invention provide an electronic circuit including a semiconductor device including a rectifying junction-shunt in parallel with an external diode having a first terminal connected to the first terminal of the semiconductor device and a second terminal connected to the second terminal of the semiconductor device.

A MOSFET according to some embodiments of the invention includes a drift layer having a first conductivity type, and a body region adjacent the drift layer, the body region having a second conductivity type opposite the first conductivity type and forming a p-n junction with the drift layer. The MOSFET further includes a source region in the body region and having the first conductivity type, and a shunt channel region on the body region and extending from the source region to the drift layer. The shunt channel region may have the first conductivity type. The MOSFET further includes a gate insulating layer on the shunt channel region between the source region and the drift layer, a gate contact on the gate insulating layer, a source contact in electrical contact with the body region and the contactor region, and a drain contact in electrical contact with the drift layer.

The shunt channel region may have a length, thickness and doping concentration selected such that the channel region is fully depleted at zero applied voltage to the first terminal and the second terminal and at a gate voltage that is less than a threshold voltage of the MOSFET. In particular, the channel region may have a doping concentration of from about 1E15 to about 5E17 cm$^{-3}$ and may have a thickness of about 0.05 µm to about 1 µm.

The length thickness and doping concentration of the shunt channel region and the doping concentration of the body region may be selected such that a conductive channel is formed in the channel region when a voltage is applied to the first terminal that is less than a built-in potential of the p-n junction between the body region and the drift layer. The body region may have a doping concentration of from about 1E16 to about 1E20 cm$^{-3}$.

The MOSFET may further include a neck implant region in the drift layer adjacent the body region and having the first conductivity type, and the shunt channel region may contact the neck implant region.

The MOSFET may further include a substrate having the first conductivity type and having a dopant concentration greater than a dopant concentration of the drift layer. The drift layer may be on the substrate and the drain contact may be on the substrate.

Some embodiments of the invention provide methods of forming an electronic device. The methods may include forming a drift layer having a first conductivity type, forming a first body region in the drift layer, the first body region having a second conductivity type opposite the first conductivity type and forming a p-n junction with the drift layer, forming a second body region having the second conductivity type on the first body region, and forming a shunt channel layer in the body region, the shunt channel region having the first conductivity type and extending between the first and second body regions to the drift layer. The shunt channel region may have a length, thickness and doping concentration selected such that the channel region is fully depleted when zero voltage is applied thereto. The methods may further include forming a contactor region in the first body region, the contactor region contacting the channel layer and having the first conductivity type.

The contactor region may include a first contactor region, and the methods may further include forming a second contactor region having the first conductivity type and extending through the first contactor region and into the first body region.

Forming the shunt channel layer may include forming a channel epitaxial layer on the drift layer and the first body region, and forming the second body region may include forming a body epitaxial layer on the channel epitaxial layer. In some embodiments, forming the channel layer may include implanting a buried channel layer in the body region.

The methods may further include forming a first terminal in electrical contact with the second body region and the contactor region, and forming a second terminal in electrical contact with the drift layer.

Forming the first body region may include selectively implanting second conductivity type impurities into the drift layer.

The methods may further include forming a gate insulator layer on the second body region between the contactor region and the drift layer, and forming a gate contact on the gate insulator layer. The methods may further include forming a threshold adjustment layer on the second body region.

Forming the threshold adjustment layer may include forming a threshold adjustment epitaxial layer on the second body region, and forming the contactor region may include selectively implanting first conductivity type impurities through the threshold adjustment epitaxial layer and into the second body region.

The methods may further include forming a neck implant region adjacent the first and second body regions. The shunt channel layer may extend from the contactor region between the first and second body regions and to the neck implant region. The neck implant region may have the first conductivity type.

A power MOSFET device according to some embodiments of the invention includes a drift layer having a first conductivity type, and a body region in the drift layer. The body region may have a second conductivity type opposite the first conductivity type and may form a p-n junction with the drift layer. The MOSFET further includes a source region having the first conductivity type in the body region, a drain region adjacent the drift layer, and a static induction rectifier (SIR) channel extending from the source region to the drift layer. The SIR channel region is configured to be fully depleted at zero drain-source voltage and to form a conductive channel between the source region and the drift layer at a source to drain voltage that is less than the built-in potential of the p-n junction between the body region and the drift layer.

Some embodiments of the invention provide a PIN or JBS diode including a drift layer having a first conductivity type, and a body region in the drift layer. The body region has a second conductivity type opposite the first conductivity type and forms a p-n junction with the drift layer. The device further includes a contactor region in the body region, the contactor region having the first conductivity type, and a static induction rectifier (SIR) channel region extending from the contactor region to the drift layer. The SIR channel region is configured to be fully depleted at zero voltage across the body region to drift region p-n junction and to form a conductive channel between the contactor region and the drift layer at an applied voltage that is less than a built-in potential of the p-n junction between the body region and the drift layer.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1:
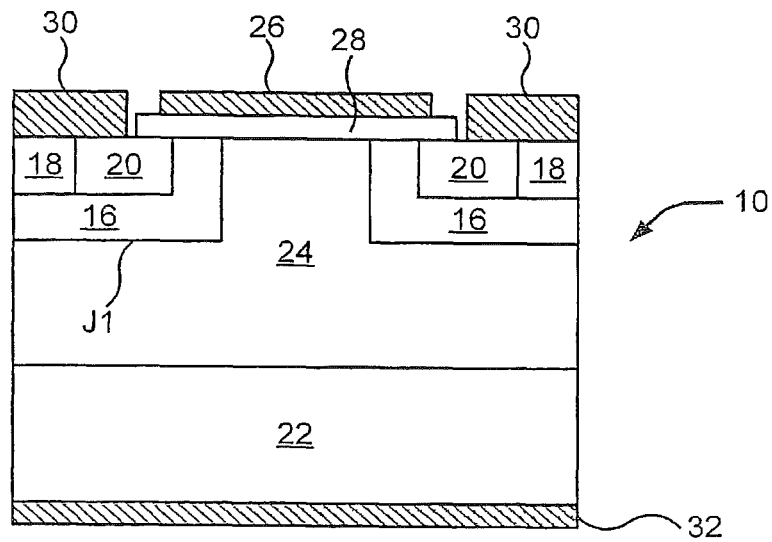
FIG. 1 is a cross sectional illustration of a conventional power MOSFET.
Figure 2:
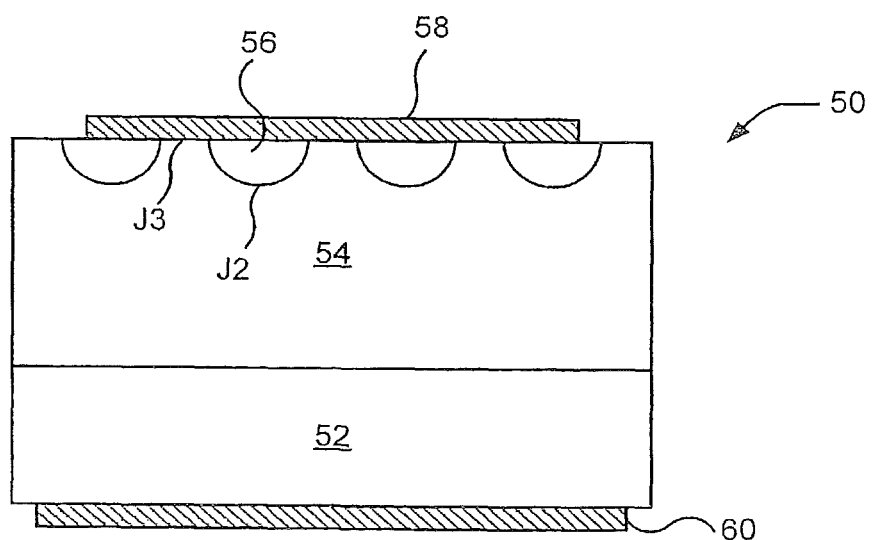
FIG. 2 is a cross sectional illustration of a conventional JBS Schottky diode.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

As used herein, the term "and/or" includes any and all combinations of one or more of the associated listed items. It will be understood that, although the terms first, second, third etc. may be used herein to describe various elements, components, regions, materials, layers and/or sections, these elements, components, regions, layers and/or sections should not be limited by these terms. These teems are only used to distinguish one element, component, region, layer, material or section from another element, component, region, layer, material or section. Thus, a first element, component, region, layer, material or section discussed below could be termed a second element, component, region, layer, material or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region. Furthermore, as will be appreciated by those skilled in the art, conductivity types of semiconductor layers of an electronic device may be reversed in certain cases.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

As noted above, typical applications for switching power devices may benefit from reverse conduction for rectification and/or clamping by an internal and/or external diode. Because power MOSFETs have an inherent PIN diode within the structure, the internal diode may be used for the rectification and clamping, or may be bypassed by an external diode. Because the inherent PIN diode of a power MOSFET may result in minority carrier injection across the drain-body junction (i.e., the PN junction at the body-to-drift-layer interface) it may have a slow reverse recovery time and/or may experience SiC crystal degradation caused by minority carrier injection.

Some embodiments of the invention provide reverse conducting static induction rectifier (SIR) junction shunts that may bypass the inherent PIN junction of a power MOSFET device. SIR junction shunts may provide benefits by: 1) bypassing current flow from an inherent internal drain-body junction of a MOSFET, thereby reducing the injection of minority carriers and decreasing the reverse recovery time of the device, and/or 2) enabling reverse current to flow for voltages lower than the built in potential of the drain-body junction (which is approximately 3 V for SiC). Thus, a device including SIR junction shunts according to some embodiments of the invention may experience lower on-state losses for lower current conditions. In addition, reduction of minority carrier injection may reduce physical degradation of crystalline SiC material in a SiC-based device.

Some embodiments of the invention also provide discrete SIR diodes that may have advantages compared to conventional JBS and/or PIN diodes, as described below.

A power MOSFET including integrated SIR drain-body junction shunts may have advantages compared to a power MOSFET in combination with an external diode for clamping or rectification, because the internal SIR shunts may be more effective than an external diode at keeping the inherent PIN diode from becoming forward biased. For example, if an external anti-parallel diode is used, the entire voltage across the external diode would appear across the MOSFET internal drain-body PN junction until the internal PN junction starts to inject minority carriers.

In contrast, an internal SIR drain-body junction shunt may begin to conduct at low voltages (approximately 1V), and the voltage drop in the device may be distributed across the internal SIR channel and the drift layer. Therefore, the source to drain voltage across the MOSFET can be larger than the built in potential of the drain-body PN junction while still reducing minority carrier injection.

In addition, an external PIN, JBS, or SIR diode can be paralleled with a power MOSFET with integrated SIR drain-body junction shunts to provide higher total diode current capability before the MOSFET drain-body diode junction begins to inject minority carriers. In that case, the integrated SIR drain-body junction shunts may permit the external diode to have a larger forward voltage drop without resulting in minority carrier injection across the drain-body junction. Consequently, a smaller area (and thus lower capacitance) JBS or SIR diode, or a PIN diode that is optimized for speed rather than on-state voltage, can be used as the external diode. This may also permit a JBS or SIR external diode to be used in place of an external PIN diode.

Figure 3A:
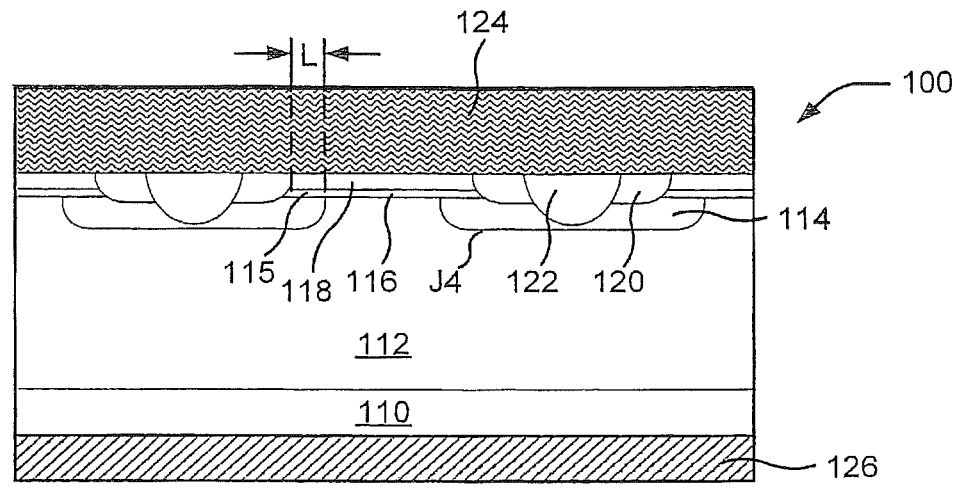
FIG. 3A is a partial cross sectional illustration of a PIN diode structure including a rectifying junction-shunt according to some embodiments of the invention.

An SIR diode structure 100 is illustrated in the partial cross-section illustration of FIG. 3A. An equivalent circuit for the SIR diode structure 100 of FIG. 3A is shown schematically in FIG. 3B. Referring to FIG. 3A, an SIR diode structure 100 includes an n+ substrate 110 on which an n-drift layer 112 is formed. The substrate may include, for example, an off-axis silicon carbide substrate of the 4H or 6H polytype, and may be doped with n-type dopants at a concentration of about 1E17 to about 1E20 cm$^{-3}$. The n-drift layer 112 may be doped with n-type dopants at a concentration of about 1E14 to about 1E18 cm$^{-3}$, and may have a thickness of about 1 μm to about 200 μm. As noted above, the thickness and doping of the drift layer 112 may be chosen to provide acceptable voltage blocking characteristics as well as an acceptable level of on-resistance.

A p+ body implant region 114 is formed in the drift layer 112, for example by implantation of p-type impurities such as aluminum and/or boron. The p+ body implant region 114 may have a doping concentration of about 1E16 to about 1E20 cm$^{-3}$, and may extend to a depth of about 1 μm into the drift layer 112. The p+ body implant region 114 forms a p+-n junction J4 with the drift layer 112. Accordingly, the p+ body implant 114, the drift layer 112 and the substrate 110 form a PIN structure.

An n+ epitaxial layer 116 is formed on the drift layer 112 including the p+ body implant region 114 and forms an SIR channel layer 116 for the device 100, as explained more fully below. The SIR channel layer 116 may be doped with n-type dopants at a concentration of about 1E15 to about 5E17 cm$^{-3}$, and may have a thickness of about 0.05 μm to about 1 μm. The SIR channel layer 116 forms an SIR channel 115 having a length L as indicated in FIG. 3A.

A p+ body epitaxial layer 118 is formed on the SIR channel layer 116. The p+ body epitaxial layer 118 has a thickness and doping chosen such that the SIR channel 115 is fully depleted at zero applied anode-to-cathode voltage. In some embodiments, the p+ body epitaxial layer 118 may be doped with p-type dopants at a concentration of about 1E16 to about 1E20 cm$^{-3}$, and may have a thickness of about 0.2 μm to about 1.5 μm.

An n++ SIR contactor region 120 is formed at the surface of the device and within the p+ body implant region 114, for example by ion implantation of n-type impurities such as nitrogen and/or phosphorus, and extends from the surface of the device through the p+ body epitaxial layer 118 and the n+ SIR channel 115 and into the p+ body implant region 114. The n++ SIR contactor region 120 may be doped with n-type dopants at a concentration of about 1E18 to about 1E21 cm$^{-3}$.

A p++ body contactor region 122 is formed at the surface of the device and adjacent the n++ SIR contactor region 120, for example by ion implantation of p-type impurities such as aluminum and/or boron, and extends from the surface of the device through the n++ SIR contactor region 120 and into the p+ body implant region 114. The p++ body contactor region 122 may be doped with p-type dopants at a concentration of about 1E18 to about 1E21 cm$^{-3}$.

An anode contact 124 of, for example, aluminum, titanium and/or nickel, is formed on the surface of the p+ body epitaxial layer 118 and forms an ohmic contact with the n++ SIR contactor region 120 and the p++ body contactor region 122. A cathode contact 126 of, for example, aluminum, titanium and/or nickel, forms an ohmic contact on the substrate 110.

As an alternative, a recess etch may be performed through the p+ body epitaxial layer 118 in order to enable contact to the p+ body region 114 and/or the SIR channel 115.

Figure 3B:
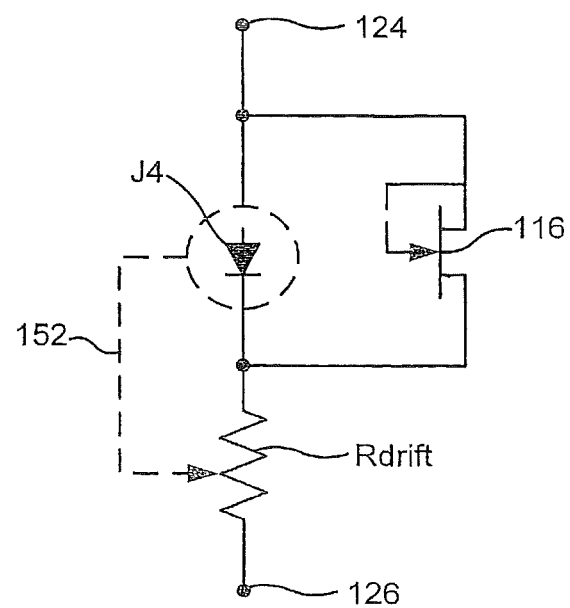
FIG. 3B is a schematic diagram of an equivalent circuit of the PIN diode structure of FIG. 3A.

As shown in the equivalent circuit of FIG. 3B, the SIR channel 115 forms a parallel shunt to the PN junction J4 between the p+ body region 114 and the n-drift layer 112. The resistance of the drift layer 112 is modulated by minority carrier injection from the PN junction J4, as shown by the dotted line 152.

In the structure 100 of FIG. 3A, the length, dopant density and thickness of the n+ SIR channel 115 are chosen so that the SIR channel layer 115 is completely depleted at zero applied anode-cathode voltage. Referring to FIGS. 3A and 3B, when the cathode 126 terminal is made more positive than the anode terminal 124, the SIR channel 115 remains depleted and the device 100 blocks voltage due to the presence of a depletion region extending into the thick low-doped drift layer 112. Conversely, when the cathode terminal voltage is reduced sufficiently below the anode terminal voltage (by an amount referred to herein as the "SIR threshold"), the width of the depletion region in the SIR channel 115 is reduced, and a space-charge-neutral conductive channel is formed in the SIR channel 115, enabling current to flow between the n++ SIR contactor region 120 and the n-drift layer 112. The shunt channel may also reduce the potential barrier formed by the body, enabling injection of majority carriers from the SIR channel into the SIR contactor. The mode of operation in which current flows primarily through the SIR channel 115 is referred to herein as the "SIR mode." The SIR threshold is determined primarily by the dopant density and thickness of the SIR channel 115, and may be designed, for example, to be about 1V. As the voltage on the cathode terminal 126 is further reduced, a resistive voltage drop occurs across both the SIR channel 115 and the drift layer 112.

As noted above, a PIN diode is formed by the body-to-drift-layer junction J4. When this junction is forward biased beyond the built-in potential of the junction (approximately 3 V for SiC), excess minority carriers are injected into the drift layer 112, resulting in conductivity modulation. This injected excess carrier charge results in slow switching speeds, because the charge must decay (i.e. the excess minority carriers in the drift region must recombine) before the device will stop conducting. The excess carrier charge can also cause degradation of the SiC material. A purpose of the SIR channel 115 is to shunt the current from the body-to-drift-layer junction J4, which may prevent the junction J4 from injecting minority carriers into the drift layer 112. The SIR channel 115 also provides current at voltages less than 3 V, and thus may provide lower rectifier on-state losses than a PIN diode for low current conditions.

When the current flowing through the device is increased above a value referred to herein as the "PIN transition current threshold", the junction voltage of the body-to-drift-layer junction J4 becomes larger than the turn-on voltage of the junction (e.g. about 3 V), and the body-to-drift-layer junction J4 begins to inject minority carriers into the drift layer 112, similar to PIN diode operation.

The PIN transition current threshold is a function of temperature, primarily due to the decrease in the mobility of the SIR channel 115 with an increase in temperature. The effective channel width, channel length, and dopant density of the SIR channel 115 affect the transition current at which the device 100 enters the PIN mode, in which current through the device is dominated by minority carrier injection across the body-to-drift-layer junction J4.

The SIR mode may have certain advantages. For example, in the SIR mode, the device 100 may conduct current for voltages less than 3 V, may have little or no reverse recovery charge, and/or may not suffer from crystal degradation as a result of minority carrier injection. For very high current density and/or high temperatures, the PIN mode may be used to provide conductivity modulation and/or lower on-resistance. A combination SIR-PIN device can be made by designing the SIR channel 115 such that the SIR channel voltage reaches the turn-on voltage of the body-to-drift-layer junction J4 (i.e. about 3 V) at a level of current where the PIN mode is beneficial.

A diode including an SIR channel 115 according to embodiments of the invention may provide certain benefits compared to a conventional PIN diode. For example, a device including an SIR channel 115 according to embodiments of the invention may provide for bypassing the body-to-drift-layer junction J4, thus reducing and/or preventing the body-to-drift-layer junction J4 from injecting majority carriers at low current densities, and thus potentially decreasing the reverse recovery time and/or crystal degradation at low current densities. In addition, a device including an SIR channel 115 according to embodiments of the invention may permit current to flow for voltages lower than the built in potential of the drain-body junction J4, and thus may experience lower on-state losses than a conventional PIN diode for low current densities.

An SIR device may also have advantages compared to a conventional Junction Barrier Schottky (JBS) diode, because an SIR diode may not have a Schottky barrier that requires shielding, so the SIR threshold for turn-on can be made smaller than the Schottky barrier height required for a JBS diode. Furthermore, the dopant density of the drift layer 112 of a SIR diode can be made higher, thus potentially resulting in a lower specific on resistance. A PIN-SIR device (i.e. a device that crosses over from SIR mode to PIN mode at a predetermined current density) may also have advantages compared to a merged PIN-Schottky in the selectivity of the current density at which the transition to PIN mode occurs.

Figure 4A:
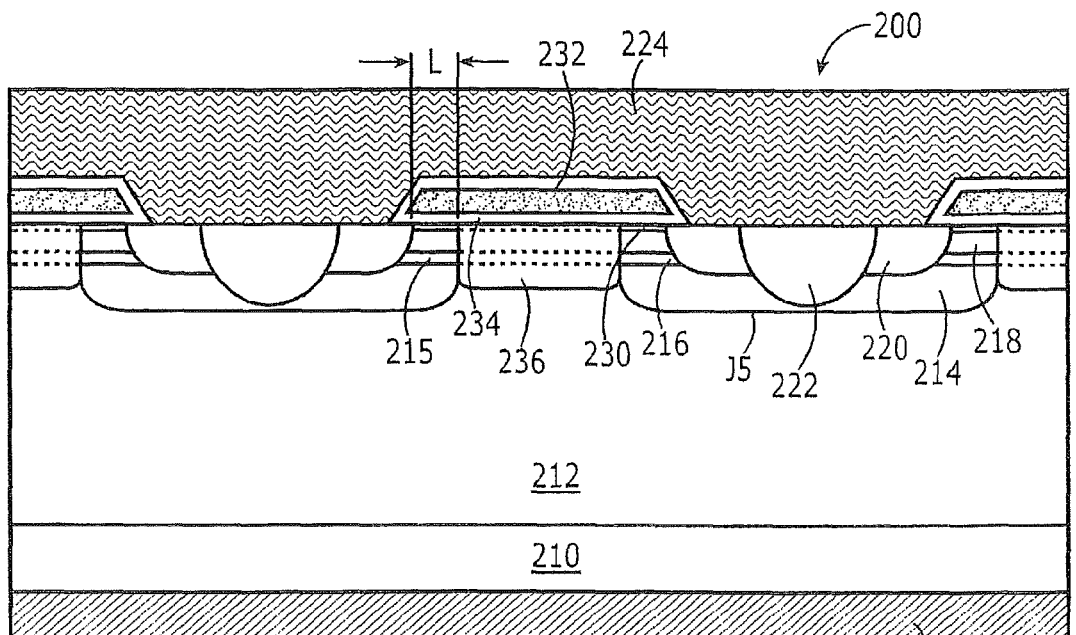
FIG. 4A is a partial cross sectional illustration of a power MOSFET structure including a rectifying junction-shunt according to some embodiments of the invention.

A power MOSFET structure 200 including SIR channel shunts is illustrated in the partial cross-section illustration of FIG. 4A. An equivalent circuit for the SIR MOSFET structure 200 of FIG. 4A is shown schematically in FIG. 4B. Referring to FIG. 4A, an SIR MOSFET structure 200 includes an n+ substrate 210 on which an n-drift layer 212 is formed. The substrate may include, for example, an off-axis silicon carbide substrate of the 4H or 6H polytype, and may be doped with n-type dopants at a concentration of about 1E17 to about 1E20 cm$^{-3}$. The n-drift layer 212 may be doped with n-type dopants at a concentration of about 1E14 to about 1E18 cm$^{-3}$, and may have a thickness of about 1 μm to about 200 μm. As noted above, the thickness and doping of the drift layer 212 may be chosen to provide acceptable voltage blocking characteristics as well as an acceptable level of on-resistance.

A p+ body implant region 214 is formed in the drift layer 212, for example by implantation of p-type impurities such as aluminum and/or boron. The p+ body implant region 214 may have a doping concentration of about 1E16 to about 1E20 cm$^{-3}$, and may extend a depth of about 1 μm into the drift layer 212. The p+ body implant 214 forms a p+-n junction J5 with the drift layer 212. Accordingly, the p+ body implant region 214, the drift layer 212 and the substrate 210 form an inherent PIN structure in the MOSFET device 200.

An n+ epitaxial layer 216 is formed on the drift layer 212 including the p+ body implant region 214 and forms an SIR channel layer 216 for the device 200. The SIR channel layer 216 may be doped with n-type dopants at a concentration of about 1E15 to about 5E17 cm$^{-3}$, and may have a thickness of about 0.05 μm to about 1 μm. The SIR channel layer 216 forms an SIR channel 215 having a length L as indicated in FIG. 4A.

A p+ body epitaxial layer 218 is formed on the SIR channel layer 216. The p+ body epitaxial layer has a thickness and doping chosen such that the SIR channel 215 is fully depleted at zero applied voltage. In some embodiments, the p+ body epitaxial layer 218 may be doped with p-type dopants at a concentration of about 1E16 to about 1E20 cm$^{-3}$, and may have a thickness of about 0.2 μm to about 1.5 μm.

An n+ channel threshold adjustment layer 230 may be formed on/in the p+ body epitaxial layer 218. The n+ channel threshold adjustment layer 230 may be doped with n-type dopants at a concentration of about 1E15 to about 5E17 cm$^{-3}$, and may have a thickness of about 0.05 μm to about 1 μm.

An n++ source/SIR contactor region 220 is formed at the surface of the device and adjacent the p+ body implant region 214, for example by ion implantation of n-type impurities such as nitrogen and/or phosphorus, and extends from the surface of the device through the p+ body epitaxial layer 218 and the SIR channel 215, and into the p+ body implant region 214. The n++ source SIR contactor region 220 may be doped with n-type dopants at a concentration of about 1E18 to about 1E21 cm$^{-3}$.

A p++ body contactor region 222 is formed at the surface of the device and within the n++ SIR contactor region 220, for example by ion implantation of p-type impurities such as aluminum and/or boron, and extends from the surface of the device through the n++ SIR contactor region 220 and into the p+ body implant region 214. The p++ body contactor region 222 may be doped with p-type dopants at a concentration of about 1E18 to about 1E21 cm$^{-3}$.

An n+ neck implant region 236 may be formed adjacent the p+ body region 214. The n+ neck implant region 236 extends from the surface of the device into the drift layer 212. As illustrated in FIG. 4A, the n+ neck implant region 236 may be formed between and in contact with a pair of adjacent body regions 214.

A gate insulator 234 and gate contact 232 are formed over the p+ body epitaxial layer 218 and the n+ channel threshold adjustment layer 230 between the n++ source/SIR contactor region 220 and the n+ neck implant region 236. The gate insulator 234 may be, for example, an oxide such as silicon dioxide.

A source contact 224 of, for example, aluminum, titanium and/or nickel, is formed on the exposed surface of the epitaxial layers and forms an ohmic contact with the n++ source/SIR contactor region 220 and the p++ body contactor region 222. The n++ source/SIR implant 220 may be masked to provide electrical contact from the p+ body epitaxial layer 218 to the p++ body contactor region 222 and/or the source contact 224, as shown in the plan view illustration of FIG. 4C. A drain contact 226 of, for example, aluminum, titanium and/or nickel, forms an ohmic contact on the substrate 210.

Figure 4B:
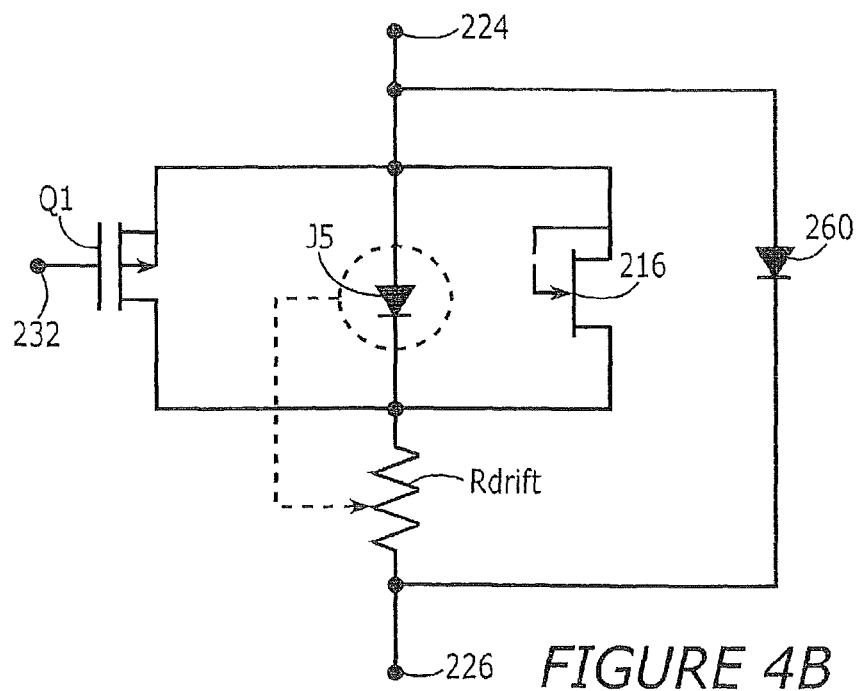
FIG. 4B is a schematic diagram of an equivalent circuit of the power MOSFET structure of FIG. 4A.
Figure 4C:
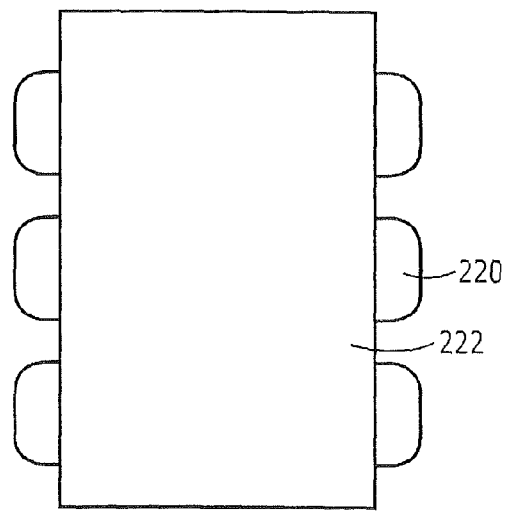
FIG. 4C is a plan view illustration showing possible mask outlines for some aspects of a power MOSFET structure including a rectifying junction-shunt according to some embodiments of the invention.

As shown in the equivalent circuit of FIG. 4B, the SIR channel 215 forms a parallel shunt to the inherent PN junction J5 between the p+ body region 214 and the n-drift layer 212. The SIR channel 215 permits current to flow in a direction from the source to the drain (i.e. in a reverse direction from the normal direction of current flow in a power MOSFET device).

Referring to FIGS. 4A and 4B, the MOSFET Q1 is formed at the surface of the body region 218 beneath the gate 232 and gate insulator 234 where the n+ channel threshold adjustment layer 230 is located. An inherent PIN diode is formed by the body-to-drift-layer junction J5 (referred to herein as the drain-body junction J5). When the drain-body junction J5 is forward biased beyond the built in potential of the junction (approximately 3 V for SiC), minority carriers are injected into the drift layer 212. The purpose of the SIR channel 215 is to shunt the current from the drain-body junction J5. This may prevent the drain-body junction J5 from injecting minority carriers into the drift layer 212, and/or may provide diode current flow from the source 224 to the drain 226 of the device 200 for voltages less than the turn on voltage of the drain-body junction J5 (e.g. about 3 V for SiC). The SIR channel layer 216 can be formed using any method that forms thin n+ channels through the body region of the Power MOSFET including the growth of thin epitaxial layers, and/or ion implantation. In some embodiments, the SIR channel layer 216 may be merged with the n+ threshold adjustment layer 230, as explained more fully below.

In the structure 200 illustrated in FIG. 3A, the length, dopant density and thickness of the n+ SIR channel 215 may be chosen such that the SIR channel 215 is completely depleted at zero applied drain-source voltage. When the drain terminal 226 is made more positive than the source terminal 224, the SIR channel 215 remains depleted, and the device blocks voltage as determined by the dopant density and thickness of the drift layer 212. Conversely, when the drain voltage is reduced sufficiently below the source voltage, the width of the depletion region within the SIR channel 215 is reduced, and the SIR channel 215 becomes conductive, thereby enabling current to flow between the n++ SIR contactor 220 and the n-drift layer 212. As the drain voltage is reduced further, a resistive voltage drop occurs across both the SIR channel 215 and the drift layer 212.

Above the PIN transition current threshold, the voltage across the drain-body junction J5 becomes larger the turn-on voltage of the junction J5, and the drain-body junction J5 begins to inject minority carriers into the drift layer 212. The PIN transition current threshold is a function of temperature, primarily due to the decrease in mobility of the SIR channel 215 with increased temperature. The SIR effective channel width, channel length, and/or dopant density may determine the PIN transition current threshold.

In a power MOSFET device, the SIR mode may have certain advantages over conventional MOSFET devices. For example, an SIR MOSFET may conduct reverse current at source-to-drain voltages less than 3 V, may have little or no reverse recovery charge, and may not suffer crystal degradation as a result of minority carrier injection into the drift layer 212. For high current densities and/or high temperatures, the PIN mode may provide conductivity modulation and/or lower on-resistance. If this is desired, a combination SIR-PIN can be made by designing the SIR channel conductance so that the SIR channel voltage reaches the turn-on voltage of the drain-body junction J5 at the current at which the PIN mode is beneficial.

In some embodiments, an external PIN, JBS, or SIR diode 260 can be provided to improve the high current conduction, in which case the internal PIN diode can be made to not inject. Thus, forward bias degradation within the MOSFET may be avoided while the external diode 260 can be designed for speed and/or forward bias degradation immunity.

Figure 5:
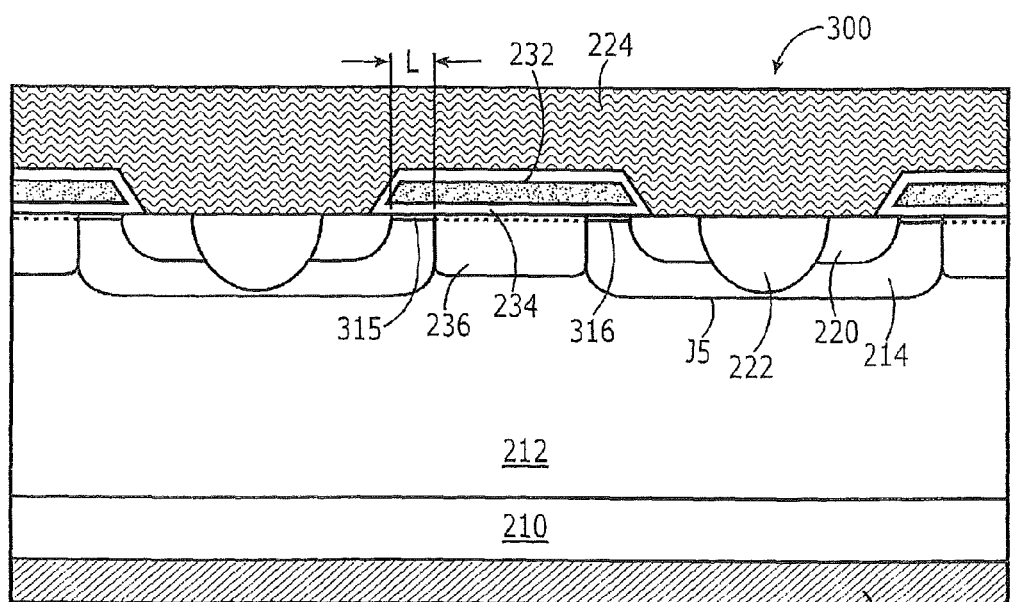
FIG. 5 is a partial cross sectional illustration of a power MOSFET structure including a rectifying junction-shunt according to further embodiments of the invention.

Referring now to FIG. 5, the threshold-voltage adjustment layer (such as the n+ channel threshold adjustment layer 230 shown in FIG. 4A) can also be designed to form an SIR channel providing reverse conducting drain-body junction shunts, while also retaining the desired threshold voltage adjustment properties for MOSFET forward bias operation. For example, in the device 300 illustrated in FIG. 5, a combined threshold adjustment layer/SIR channel layer 316 is provided between the n+ source/SIR contactor region 220 and the n+ neck implant region 236. The SIR channel layer 316 forms an SIR channel 315 having a length L as indicated in FIG. 5.

For MOSFET forward drain voltage operation, the total charge per unit area of the threshold-voltage adjustment/SIR channel layer (or layers) 316 can be designed such that the SIR channel 315 is fully depleted by the p+ body region 214 while the gate voltage is less than or equal to zero and the drain voltages is greater than zero (to prevent leakage for forward voltage blocking). In addition, the merged threshold-voltage adjustment/SIR channel layer 316 can be designed such that the MOSFET channel threshold-voltage is above zero for the full operating temperature range (to provide normally off operation). Thus, the same layer or layers used for the threshold adjustment can also be designed to have sufficient SIR channel conduction in the reverse direction for gate voltages near zero to prevent the drain-body PN junction J5 from injecting for a range of currents and temperatures.

In some embodiments, the merged threshold-voltage adjustment/SIR channel layer 316 may be doped with n-type dopants at a concentration of about 1E15 to about 5E17 cm$^{-3}$, and may have a thickness of about 0.05 μm to about 1 μm.

A SIR MOSFET 300 including a merged SIR-channel/threshold adjustment layer 316 may have some advantages compared to an SIR MOSFET having separate SIR channels, in that it may require fewer processing steps to produce and connect the SIR channels. However, a disadvantage of the merged structure is that there is a trade-off between the requirements for the MOSFET channel adjustment function and the reverse conducting SIR function. This trade-off may limit the ability of a device to obtain a high PIN-transition-current. An additional disadvantage of the merged SIR-channel/threshold-adjust layer is that the gate voltage may reduce the SIR channel conductance for gate voltages below zero. Accordingly, the gate drive circuit may be designed to switch the gate to zero voltage, rather than to a negative voltage, during the MOSFET off-state.

Figure 6A:
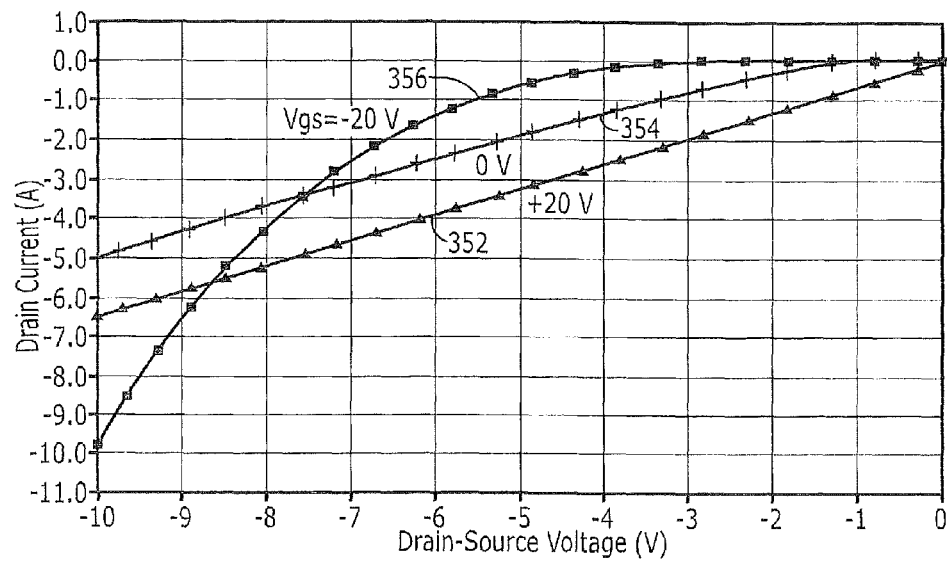
FIG. 6A is a graph of measured drain current versus drain-source voltage for a power MOSFET including a rectifying junction-shunt according to some embodiments of the invention.
Figure 6B:
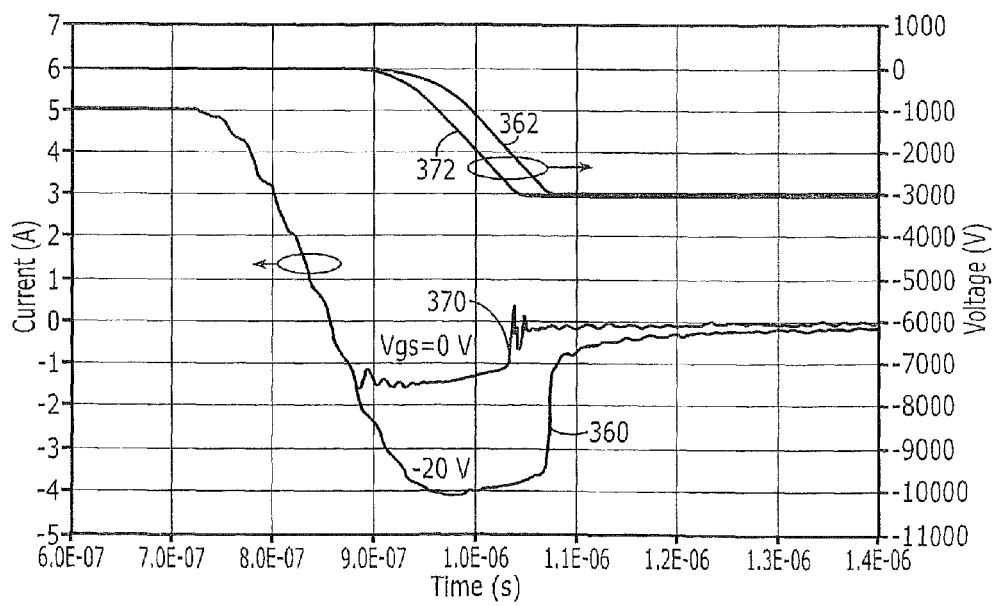
FIG. 6B is a graph of measured drain current and drain voltage versus time for a power MOSFET including a rectifying junction-shunt according to some embodiments of the invention.

The operation of reverse conducting SIR channels may be demonstrated using a power MOSFET with SIR drain-body junction shunts that are merged with threshold adjust layer as in the embodiments of FIG. 5, because the MOSFET gate voltage can be used to show the drain-body PN junction behavior with, and without, the SIR channels conducting. In addition, the MOSFET channel can be used to provide a reference to the resistance of the drift layer. FIGS. 6A and 6B illustrate the static and dynamic performance of a 0.15 cm$^2$, 10-kV SiC Power MOSFET including SIR drain-body junction shunts that are merged with a threshold adjust layer, for various bias conditions at 125° C.

In particular, FIG. 6A is a graph of measured drain current versus drain-source voltage for a power MOSFET including SIR drain-body junction shunts that are merged with a threshold adjust layer, while FIG. 6B is a graph of measured drain current and drain voltage versus time for the power MOSFET of FIG. 6A. The static characteristics shown in FIG. 6A are for gate-source voltages (Vgs) of +20 V, 0 V, and −20 V.

As shown by curve 352, a Vgs of +20 V results in the formation of a low resistance MOSFET channel in series with the drift-layer resistance. Thus at a gate-source voltage Vgs of +20V, the device operates similar to a conventional power MOSFET. The induced MOSFET channel also shunts the drain-body PN junction J5, preventing minority carrier injection. However, this mode of operation is not readily used for reverse bias rectification because it may require synchronization of the gate voltage with the reverse conduction events (such as in a synchronous rectifier).

The 0 V curve (curve 354) in FIG. 6A shows that a gate-source voltage Vgs of 0 V results in a reverse conducting SIR channel that begins to conduct at a drain voltage of about −1.25 V. As the drain voltage is reduced further, the voltage across the SIR channel reaches approximately 2 V and the voltage drop across the drift-layer resistance is the same as that for the +20 V curve 352 (i.e., the two curves are parallel with a 2 V offset).

For a gate-source voltage Vgs of −20V (illustrated by curve 356), neither a MOSFET channel nor an SIR channel are formed, and the drain-body junction J5 conducts all of the current, as indicated by the 3 V built in potential and the exponential shape of the drain current.

FIG. 6B is a graph of measured drain current and drain voltage versus time for the power SIR MOSFET of FIG. 6A showing the reverse recovery characteristics of an SIR MOSFET according to some embodiments of the invention. Curve 360 shows the drain current and curve 362 shows the drain voltage of the device at a constant gate-source voltage of about −20 V (at which no SIR channel is formed). Curve 370 shows the drain current and curve 372 shows the drain voltage of the device at a constant gate-source voltage of 0 V (at which an SIR channel is fanned).

As shown in FIG. 6B, the reverse recovery charge (i.e. the area below zero current for curves 360 and 370 in FIG. 6B) is much larger for the −20 V curve (curve 360), because the drain-body PN junction J5 injects minority carriers into the drift layer that must decay during the reverse recovery event. A comparison of the drain voltage curves 362 and 372 shows that the device switches to a blocking state faster when an SIR channel is formed.

Figure 6C:
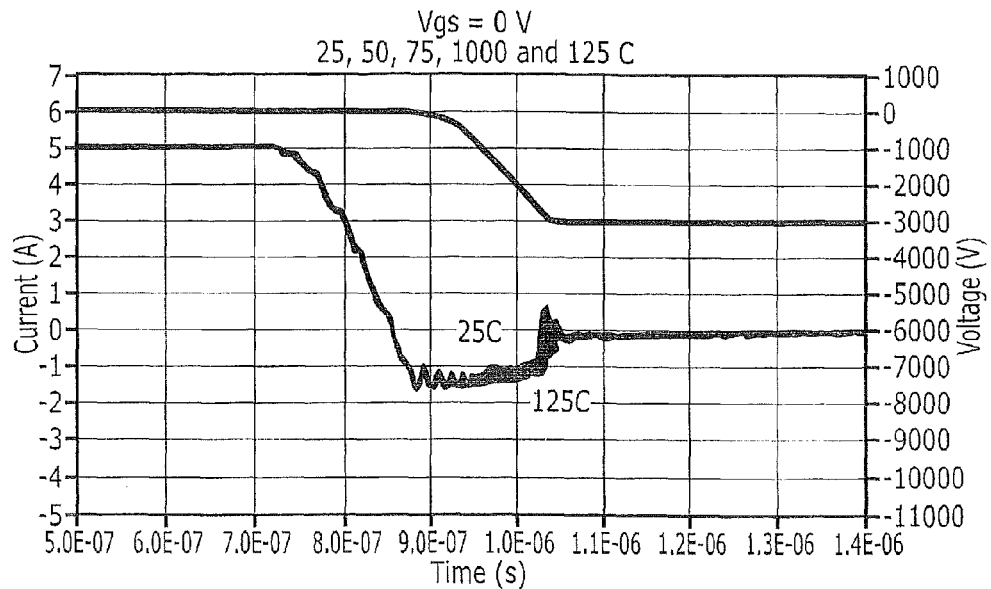
FIG. 6C is a graph of measured drain current and drain voltage versus time for a power MOSFET including a rectifying junction-shunt according to some embodiments of the invention for various temperatures at a gate to source voltage of 0V.
Figure 6D:
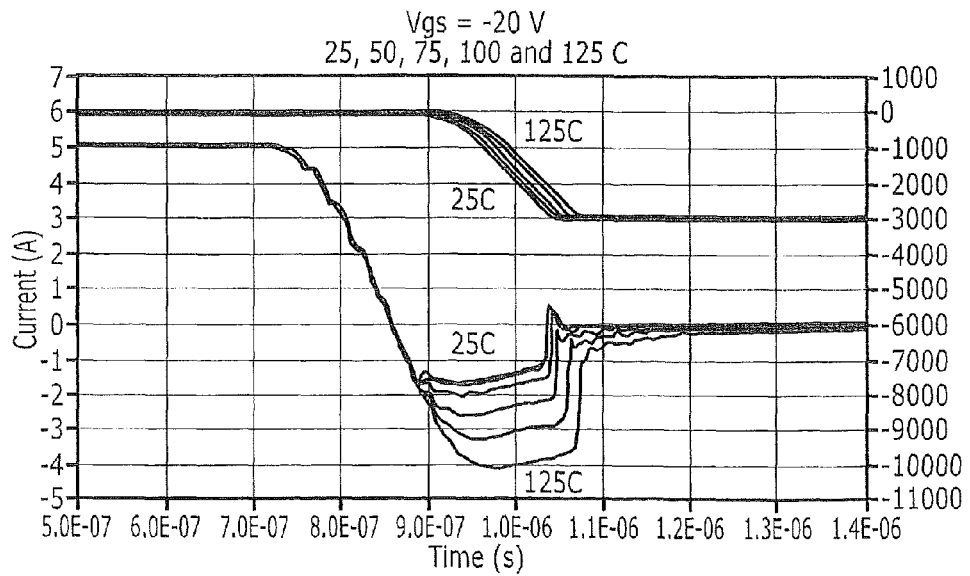
FIG. 6D is a graph of measured drain current and drain voltage versus time for a power MOSFET including a rectifying junction-shunt according to some embodiments of the invention for various temperatures at a gate to source voltage of −20V.

As shown in FIG. 6C, the reverse recovery time for a gate-source voltage Vgs of 0 V may be similar for temperatures less than 125° C. because the reverse recovery time may be determined by the drain-body junction capacitance and not by the injection of minority carrier charge. In contrast, as shown in FIG. 6D, the reverse recovery time for a gate-source voltage Vgs of −20 V case may increase continuously from 25° C. to 200° C., because the reverse recovery time is affected by minority carrier injection and by excess carrier decay time, which increases with temperature.

It should be noted that the PIN diode in the MOSFET device of FIGS. 6A and 6B may have relatively low excess carrier injection due to the low lifetime of the drift layer and/or implant damage at the drain-body junction. This may result in a relatively faster speed but lower conduction capability than typical PIN diodes with more excess carrier injection. Even with the relatively low excess minority carrier injection, however, the switching losses are much lower with the reverse conducting SIR drain-body junction shunts, which may lead to substantial efficiency and/or cooling benefits for high-frequency (e.g., 20 kHz) switching.

For example, the SIR mode illustrated in curve 354 of FIG. 6A results in 50 W conduction loss at 5 A, while the PIN mode illustrated in curve 356 results in 42 W at 5 A, or 167 W/cm$^2$ and 140 W/cm$^2$ respectively for a 0.15 cm$^2$ device active area at 50% duty cycle. The switching energy loss (in the diode plus that induced in the complementary MOSFET due to the diode reverse recovery) is essentially equal to the diode reverse recovery charge times the device operating voltage. For the 5 A current waveforms of FIG. 6B and a typical 5 kV operating voltage for the 10 kV device design, the switching energy for this example is approximately 10 mJ/cm$^2$ for the SIR mode and 40 mJ/cm$^2$ for the PIN mode. Multiplying this switching energy loss by 20 kHz results in 200 W/cm$^2$ for the SIR mode and 800 W/cm$^2$ for the PIN diode mode. It should be noted that the 867 W/cm$^2$ total loss for the PIN diode mode in this example is well beyond the cooling capability of typical power device packages, whereas the MOSFET with reverse conducting SIR drain-body shunts would be suitable for typical power device package cooling capability with currents approaching 30 A/cm$^2$.

Figure 7:
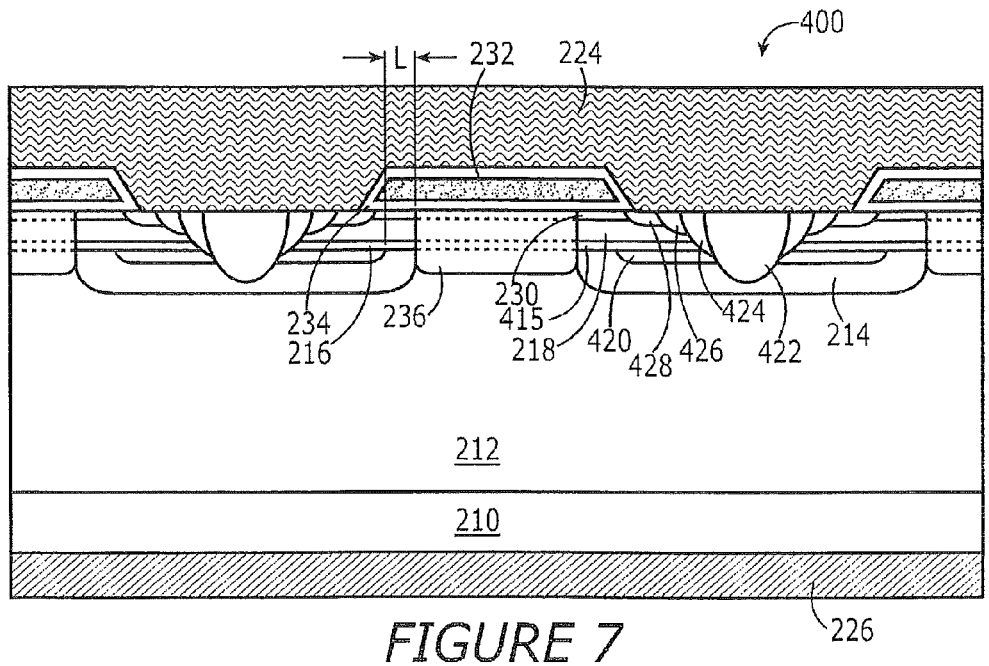
FIGS. 7 and 8 are a partial cross sectional illustrations of power MOSFET structures including a rectifying junction-shunts according to further embodiments of the invention.
Figure 8:
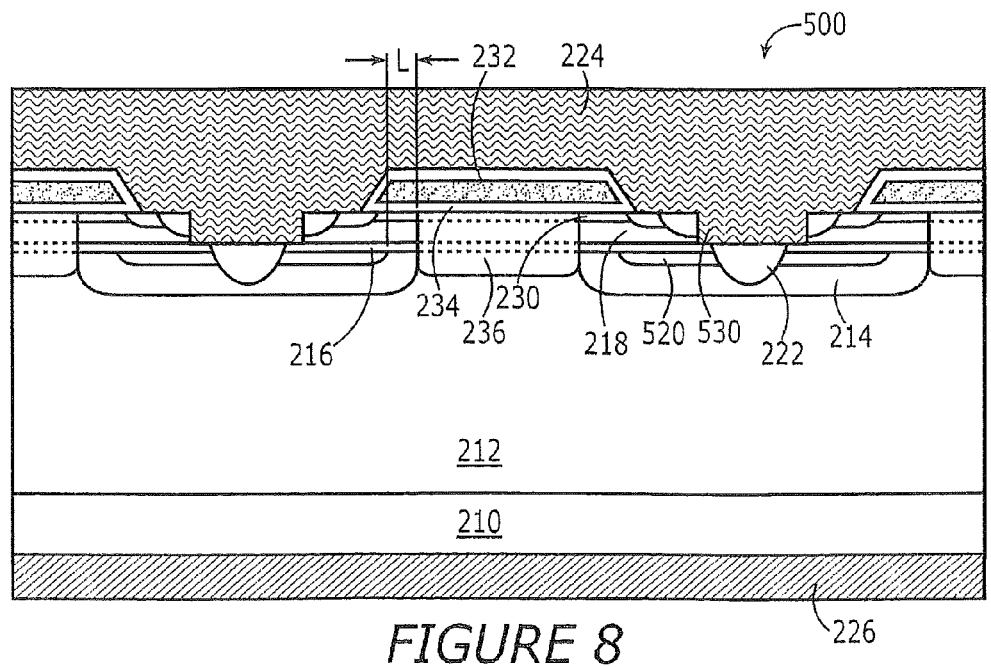

Some additional embodiments of a SIR MOSFET are illustrated in FIGS. 7 and 8. For example, a SIR MOSFET 400 shown in FIG. 7 includes a lateral n++ SIR connector region 420 that extends laterally from a vertical n++ contactor region 424 to the SIR channel 415. Additional implant regions may provide electrical contact to the other regions within the body. For example, the p++ implant region 422 may provide contact to the lower body region 214, the p++ implant region 426 may provide contact to the upper body region 218, and the n++ implant region 428 may form the source contact for the MOSFET channel.

FIG. 8 illustrates an SIR MOSFET structure 500 that is similar to the SIR MOSFET structure 400 of FIG. 7, except that the structure 500 includes a recess 530 that may penetrate the upper body region 218 and/or the lateral SIR contactor 520. The source contact metal 224 extends into the recess 530 and contacts the lateral n++ SIR contactor region 520, and/or the body regions 214 and/or 218. Accordingly, formation of a separate vertical n++ contactor region 424 may be avoided, the p++ upper body contactor 426 may be made smaller or eliminated, the p++ lower body contactor 222 may be made smaller or eliminated, and/or the packing density of devices may be improved.

Figure 9A:
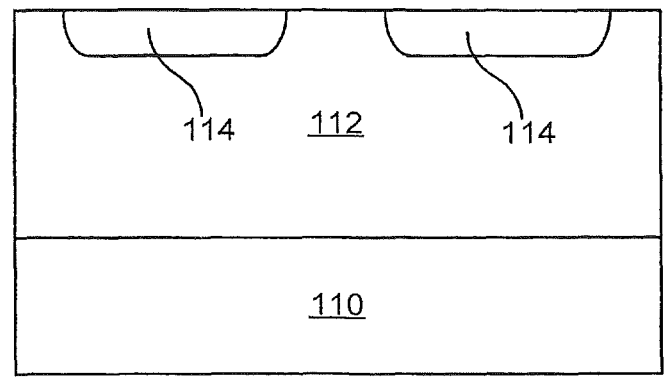
FIGS. 9A-9D are partial cross sectional drawings illustrating the formation of a PIN diode structure including a rectifying junction-shunt according to some embodiments of the invention.

The formation of an SIR diode according to some embodiments of the invention is illustrated in FIGS. 9A-9D. Referring to FIG. 9A, an n+ substrate 110 is provided, and an n-drift layer 112 is formed on the substrate, for example, by epitaxial growth. The substrate may include, for example, an off-axis silicon carbide substrate of the 4H or 6H polytype, and may be doped with n-type dopants at a concentration of about 1E17 to about 1E20 cm$^{-3}$. The n-drift layer 112 may be doped with n-type dopants at a concentration of about 1E14 to about 1E18 cm$^{-3}$, and may have a thickness of about 1 μm to about 200 μm. As noted above, the thickness and doping of the drift layer 112 may be chosen to provide acceptable voltage blocking characteristics as well as an acceptable level of on-resistance.

P+ body implant regions 114 are formed in the drift layer 112, for example by selective implantation of p-type impurities such as aluminum and/or boron. The p+ body implant regions 114 may have a doping concentration of about 1E16 to about 1E20 cm$^{-3}$, and may extend a depth of about 1 μm into the drift layer 112. In particular embodiments, the p+ body implant regions 114 may be formed by implanting Al ions at an implant energy of about 360 keV and a dose of about 4E14 ions/cm$^2$.

Figure 9B:
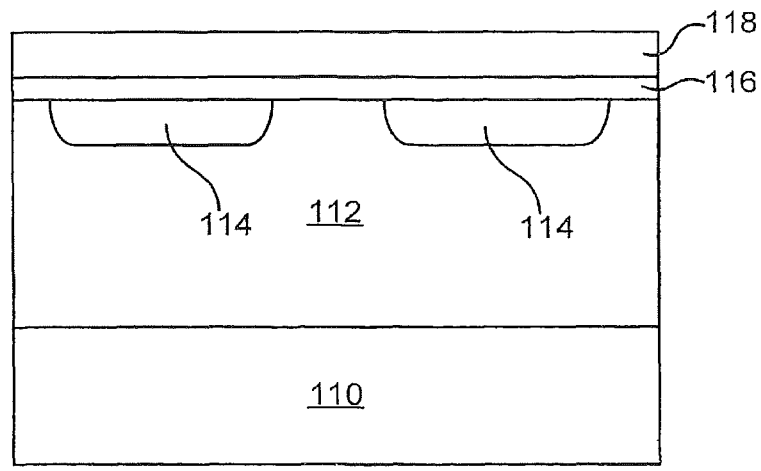

Referring to FIG. 9B, an n+ epitaxial layer 116 is formed on the drift layer 112 including the p+ body implant regions 114 to form an SIR channel layer for the device 100. The SIR channel layer 116 may be doped with n-type dopants at a concentration of about 1E15 to about 5E17 cm$^{-3}$, and may have a thickness of about 0.05 μm to about 1 μm.

A p+ body epitaxial layer 118 is formed on the SIR channel layer 116. The p+ body epitaxial layer 118 has a thickness and doping chosen such that the SIR channel layer 116 is fully depleted at zero applied voltage. In some embodiments, the p+ body epitaxial layer 118 may be doped with p-type dopants at a concentration of about 1E16 to about 1E20 cm$^{-3}$, and may have a thickness of about 0.2 to about 1.5 μm.

In some embodiments, the SIR channel layer 116 may be formed by implantation of n-type impurities into the p+ body implant regions 114 to form buried n+ regions, which may obviate the need for the p+ body epitaxial layer 118. In this embodiment, a Schottky junction is formed for the portions of the drift layer 112 at the surface in contact with the metal contact 124 described below.

Figure 9C:
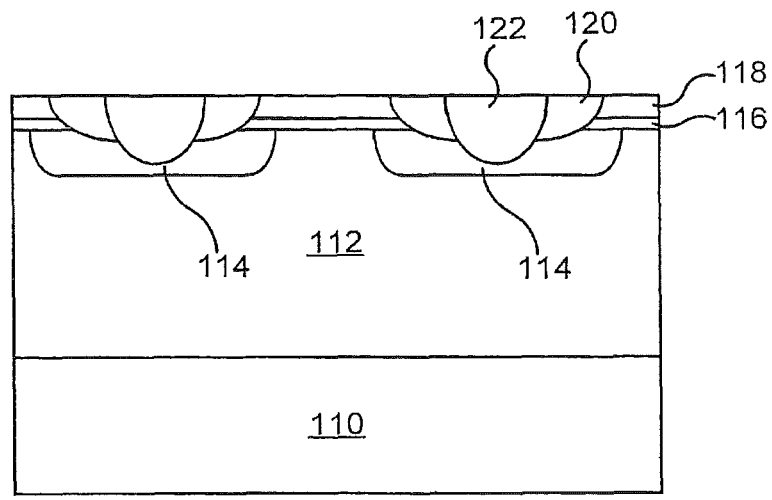

Referring to FIG. 9C, n++ SIR contactor regions 120 are formed at the surface of the device and within the area of the p+ body implant regions 114, for example by ion implantation of n-type impurities such as nitrogen and/or phosphorus, and extend from the surface of the device through the n+ SIR channel 116 and into the p+ body implant regions 114. The n++ SIR contactor regions 120 may be doped with n-type dopants at a concentration of about 1E18 to about 1E21 cm$^{-3}$. In particular embodiments, the n++ SIR contactor regions 122 may be formed by implanting N ions at an implant energy of about 100 keV and a dose of about 1E15 ions/cm$^2$.

P++ body contactor regions 122 are formed at the surface of the device and within the n++ SIR contactor regions 120, for example by ion implantation of p-type impurities such as aluminum and/or boron, and extend from the surface of the device through the n++ SIR contactor regions 120 and into the p+ body implant regions 114. The p++ body contactor regions 122 may be doped with p-type dopants at a concentration of about 1E18 to about 1E21 cm$^{-3}$. In particular embodiments, the p++ body contactor regions 122 may be formed by implanting Al ions at an implant energy of about 180 keV and a dose of about 1E15 ions/cm$^2$.

Figure 9D:
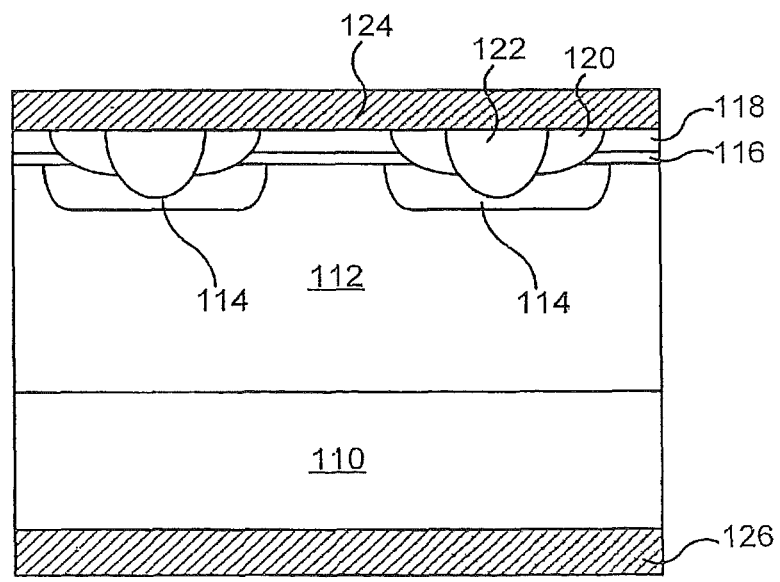

Referring to FIG. 9D, an anode contact 124 of, for example, aluminum, titanium and/or nickel, is formed on the surface of the p+ body epitaxial layer 118 and forms an ohmic contact with the n++ SIR contactor regions 120 and the p++ body contactor regions 122. A cathode contact 126 of, for example, aluminum, titanium and/or nickel, forms an ohmic contact on the substrate 110.

The formation of an SIR power MOSFET according to some embodiments of the invention is illustrated in FIGS. 10A-10D.

Figure 10A:
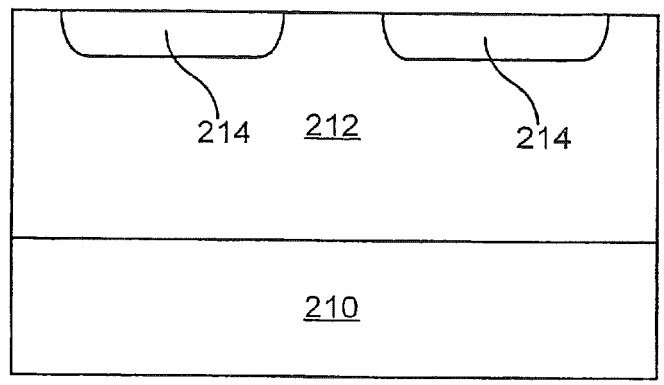
FIGS. 10A-10D are partial cross sectional drawings illustrating the formation of a power MOSFET structure including a rectifying junction-shunt according to some embodiments of the invention.

Referring to FIG. 10A, an n+ substrate 210 is provided, and an n-drift layer 212 is formed on the substrate 210. The substrate 210, which forms a drain region of the MOSFET, may include, for example, an off-axis silicon carbide substrate of the 4H or 6H polytype, and may be doped with n-type dopants at a concentration of about 1E17 to about 1E20 cm$^{-3}$. The n-drift layer 212 may be doped with n-type dopants at a concentration of about 1E14 to about 1E18 cm$^{-3}$, and may have a thickness of about 1 to about 200 µm. As noted above, the thickness and doping of the drift layer 212 may be chosen to provide acceptable voltage blocking characteristics as well as an acceptable level of on-resistance.

P+ body implant regions 214 are formed in the drift layer 212, for example by implantation of p-type impurities such as aluminum and/or boron. The p+ body implant regions 214 may have a doping concentration of about 1E16 to about 1E20 cm$^{-3}$, and may extend a depth of about 1 µm into the drift layer 212. In particular embodiments, the p+ body implant regions 214 may be formed by implanting Al ions at an implant energy of about 360 keV and a dose of about 4E14 ions/cm$^2$.

Figure 10B:
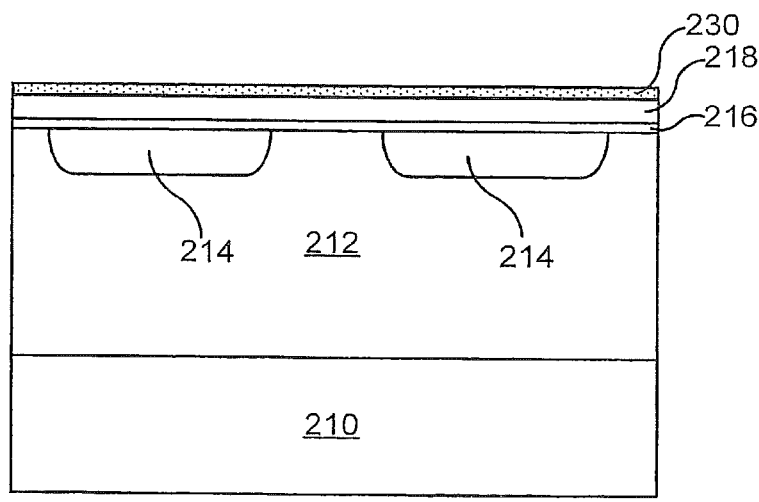

Referring to FIG. 10B, an n+ epitaxial layer 216 is formed on the drift layer 212 including the p+ body implant regions 214 and forms an SIR channel layer 216 for the device 200. The SIR channel layer 216 may be doped with n-type dopants at a concentration of about 1E15 to about 5E17 cm$^{-3}$, and may have a thickness of about 0.05 µm to about 1 µm.

A p+ body epitaxial layer 218 is formed on the SIR channel layer 216. The p+ body epitaxial layer has a thickness and doping chosen such that the SIR channel layer 216 is fully depleted at zero applied voltage. In some embodiments, the p+ body epitaxial layer 218 may be doped with p-type dopants at a concentration of about 1E16 to about 1E20 cm$^{-3}$, and may have a thickness of about 0.2 to about 1 µm.

In some embodiments, the SIR channel layer 216 may be formed by implantation of n-type impurities into the p+ body implant regions 214 to form buried n+ regions, which may obviate the need for the p+ body epitaxial layer 218.

An n+ channel threshold adjustment layer 230 may be formed on the p+ body epitaxial layer 218. The n+ channel threshold adjustment layer 230 may be doped with n-type dopants at a concentration of about 1E15 to about 5E17 cm$^{-3}$, and may have a thickness of about 0.05 µm to about 1 µm. The n+ channel threshold adjustment layer 230 may be formed by implantation and/or epitaxial growth.

Figure 10C:
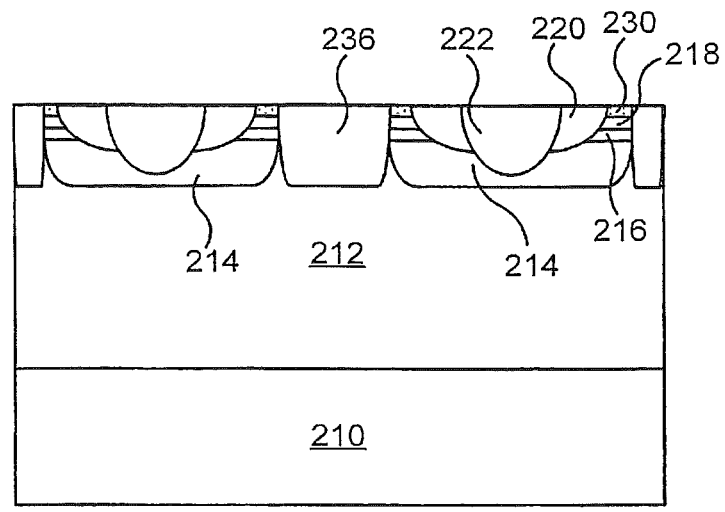

Referring to FIG. 10C, n++ source/SIR contactor regions 220 are formed at the surface of the device and within the p+ body implant regions 214, for example by ion implantation of n-type impurities such as nitrogen and/or phosphorus, and extend from the surface of the device through the SIR channel 216 and into the p+ body implant regions 214. The n++ source SIR contactor regions 220 may be doped with n-type dopants at a concentration of about 1E18 to about 1E21 cm$^{-3}$. In particular embodiments, the n++ source SIR contactor regions 220 may be formed by implanting N ions at an implant energy of about 100 keV and a dose of about 1E15 ions/cm$^2$.

P++ body contactor regions 222 are formed at the surface of the device and within the n++ SIR contactor regions 220, for example by ion implantation of p-type impurities such as aluminum and/or boron, and extends from the surface of the device through the n++ SIR contactor regions 220 and into the p+ body implant region 214. The p++ body contactor regions 222 may be doped with p-type dopants at a concentration of about 1E18 to about 1E21 cm$^{-3}$. In particular embodiments, the p++ body contactor regions 222 may be formed by implanting Al ions at an implant energy of about 360 keV and a dose of about 4E14 ions/cm$^2$.

An n+ neck implant region 236 may be formed adjacent the p+ body regions 214. The n+ neck implant region 236 extends from the surface of the device into the drift layer 212. As illustrated in FIG. 4A, the n+ neck implant region 236 may be formed between and in contact with a pair of adjacent body regions 214. In particular embodiments, the n+ neck implant region 236 may be formed by implanting N ions at an implant energy of about 360 keV and a dose of about 5E11 ions/cm$^2$.

Figure 10D:
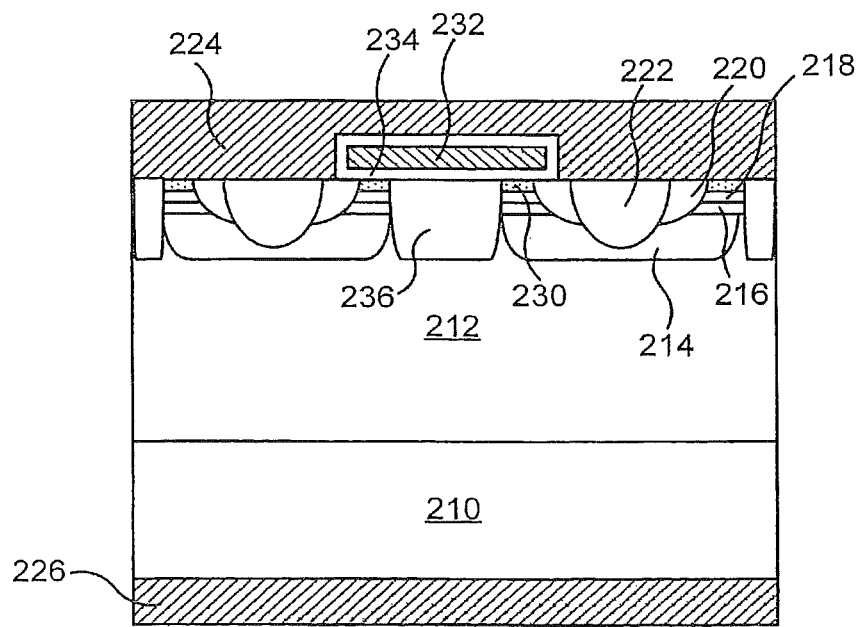

Referring to FIG. 10D, a gate insulator 234 and gate contact 232 are formed over the p+ body epitaxial layer 218 and the n+ channel threshold adjustment layer 230 between the n++ source/SIR contactor regions 220 and the n+ neck implant region 236. The gate insulator 234 may include a thermal oxide, and the gate electrode may include polysilicon and/or a refractory metal, such as Mo.

A source contact 224 of, for example, aluminum, titanium and/or nickel, is formed on the exposed surface of the epitaxial layers and forms an ohmic contact with the n++ source/ SIR contactor regions 220 and the p++ body contactor regions 222. The p+ body epitaxial layer 218 may be in electrical contact with the source contact 224 and/or in electrical contact with the p++ body contactor regions 222 in regions where the n++ source/SIR contactor regions 220 implants are masked. A drain contact 226 of, for example, aluminum, titanium and/or nickel, forms an ohmic contact on the substrate 210.

Figure 11A:
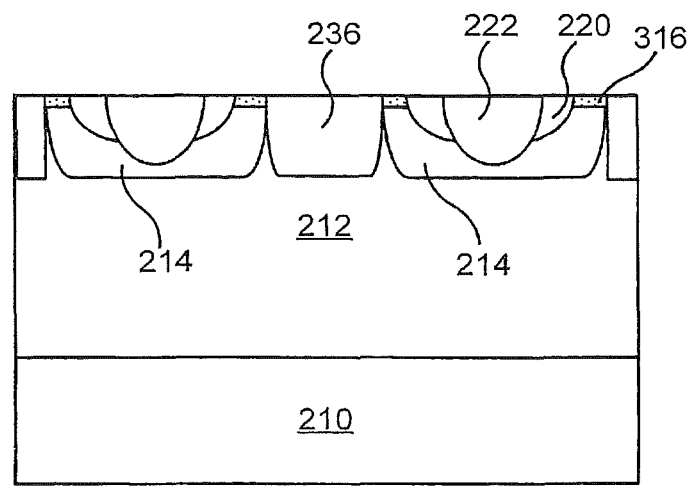
FIGS. 11A-11B are partial cross sectional drawings illustrating the formation of a power MOSFET structure including a rectifying junction-shunt according to further embodiments of the invention.
Figure 11B:
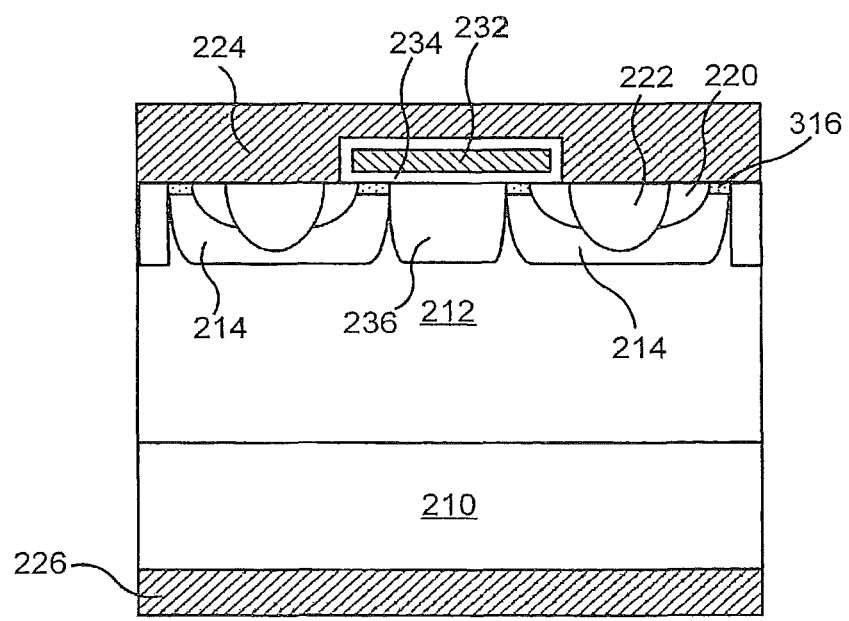

The formation of an SIR power MOSFET including merged SIR channels and threshold adjustment layers according to some embodiments of the invention is illustrated in FIGS. 11A-11B. The formation of an SIR power MOSFET including merged SIR channels and threshold adjustment layers is similar to the process described above with reference to FIGS. 10A-10D, except that a merged threshold-voltage adjustment/SIR channel layer 316 is formed on the drift layer 212. The merged threshold-voltage adjustment/SIR channel layer 316 may be doped with n-type dopants at a concentration of about 1E15 to about 5E17 cm$^{-3}$, and may have a thickness of about 0.05 µm to about 1 µm.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A power MOSFET device, comprising:
    a drift layer having a first conductivity type;
    a body region in the drift layer, the body region having a second conductivity type opposite the first conductivity type and forming a p-n junction with the drift layer;
    a source region in the body region, the source region having the first conductivity type;
    a drain region adjacent the drift layer; and
    a reverse conducting static induction rectifier (SIR) channel region comprising a buried region in the body region, the SIR channel region extending through the body region from the source region to the drift layer, wherein the reverse conducting SIR channel region is configured to be fully depleted at zero drain-source voltage and to form a conductive channel between the source region and the drift layer at a source to drain voltage that is less than a built-in potential of the p-n junction between the body region and the drift layer.

2. The power MOSFET device of claim 1, further comprising:
    a substrate having the first conductivity type and having a dopant concentration greater than a dopant concentration of the drift layer, wherein the drift layer is on the substrate.

3. The power MOSFET device of claim 1, wherein the body region comprises a first body region and a second body region, wherein the first body region comprises an implanted region in the drift layer, and wherein the reverse conducting SIR channel region comprises an epitaxial layer on the drift layer, and wherein the second body region comprises a body epitaxial layer on the reverse conducting SIR channel region.

4. The power MOSFET device of claim 3, further comprising a contactor region that extends through the second body region and into the first body region.

5. The power MOSFET device of claim 4, wherein the contactor region comprises a first contactor region, and the power MOSFET device further comprises a second contactor region having the second conductivity type and extending into the first body region.

6. The power MOSFET device of claim 4, further comprising a recess within the second body region and a conductive material in the recess, and wherein the contactor region comprises a horizontal contactor region in contact with the recess and extending from the recess to the reverse conducting SIR channel region.

7. A diode, comprising:
a drift layer having a first conductivity type;
a body region in the drift layer, the body region having a second conductivity type opposite the first conductivity type and forming a p-n junction with the drift layer;
a contactor region in the body region, the contactor region having the first conductivity type;
a static induction rectifier (SIR) channel region region comprising a buried region in the body region, the SIR channel region extending through the body region from the contactor region to the drift layer, wherein the SIR channel region is configured to be fully depleted at zero drain-source voltage and to form a conductive channel between the contactor region and the drift layer at a forward voltage applied to the contactor region that is less than a built-in potential of the p-n junction between the body region and the drift layer; an anode contact on the contactor region; and a cathode contact on the drift layer.

8. The diode of claim 7, further comprising:
a substrate having the first conductivity type and having a dopant concentration greater than a dopant concentration of the drift layer, wherein the drift layer is on the substrate.

9. The diode of claim 7, wherein the body region comprises a first body region and a second body region, wherein the first body region comprises an implanted region in the drift layer, and wherein the SIR channel region comprises an epitaxial layer on the drift layer, and wherein the second body region comprises a body epitaxial layer on the SIR channel region.

10. The diode of claim 9, wherein the contactor region extends through the second body region and into the first body region.

11. The diode of claim 7, wherein the contactor region comprises a first contactor region, and the diode further comprises a second contactor region having the second conductivity type and extending into the first body region.

12. The diode of claim 7, wherein the body region comprises a first body region and a second body region, the diode further comprising a recess within the second body region and a conductive material in the recess, and wherein the contactor region comprises a horizontal contactor region in contact with the recess and extending from the recess to the channel region.

13. A semiconductor device, comprising:
a semiconductor layer;
a body region having a first conductivity type and forming a p-n junction with the semiconductor layer;
a contactor region on the body region opposite the semiconductor layer and having a second conductivity type opposite the first conductivity type;
a shunt channel region comprising a buried region in the body region that extends from the contactor region through the body region to the semiconductor layer, and that forms a conductive channel between the contactor region and the semiconductor layer in response to a forward voltage applied between the contactor region and the semiconductor layer that is less than a built-in potential of the p-n junction.

14. The semiconductor device of claim 13, wherein the shunt channel region has a length, thickness and doping concentration selected such that the shunt channel region is fully depleted when zero voltage is applied across the first and second terminals.

15. The semiconductor device of claim 13, wherein the body region comprises an implanted region in the semiconductor layer, and wherein the shunt channel region comprises an epitaxial layer on the semiconductor layer.

16. The semiconductor device of claim 13, wherein the contactor region comprises a first contactor region in contact with the shunt channel region and the body region, and the semiconductor device further comprises a second contactor region having the second conductivity type and extending into the body region and spaced apart from the shunt channel region.

17. The semiconductor device of claim 13, wherein the body region comprises a first body region and a second body region, the semiconductor device further comprising:
a gate insulator layer on a surface of the second body region between the contactor region and the semiconductor layer; and
a gate contact on the gate insulator layer.

18. The semiconductor device of claim 17, further comprising a threshold adjustment layer on the body region, the threshold adjustment layer having a doping concentration selected to adjust a threshold voltage of the semiconductor device.

19. The semiconductor device of claim 17, further comprising a neck implant region adjacent the body region, the neck implant region having the first conductivity type, wherein the shunt channel region extends between the contactor region and the neck implant region.

20. The semiconductor device of claim 13, wherein the contactor region comprises a vertical contactor region extending from a surface of the semiconductor device into the second body region and a horizontal contactor region in contact with the vertical contactor region and extending from the vertical contactor region to the shunt channel region.

21. The semiconductor device of claim 13, wherein the body region comprises a first body region and a second body region, the semiconductor device further comprising a recess within the second body region and a conductive material in the recess, and wherein the contactor region comprises a horizontal contactor region in contact with the recess and extending from the recess to the channel region.

* * * * *

UNITED STATES PATENT AND TRADEMARK OFFICE
CERTIFICATE OF CORRECTION

| | | |
|---|---|---|
| PATENT NO. | : 8,546,874 B2 | Page 1 of 1 |
| APPLICATION NO. | : 13/267966 | |
| DATED | : October 1, 2013 | |
| INVENTOR(S) | : Hefner et al. | |

It is certified that error appears in the above-identified patent and that said Letters Patent is hereby corrected as shown below:

In the Specification:
Column 16, Line 51: Please correct "channel is fanned)."
                 to read -- channel is formed). --

In the Claims:
Column 21, Claim 7, Lines 29 and 30:
        Please correct "channel region region comprising"
                to read -- channel region comprising --

Signed and Sealed this
Tenth Day of March, 2015

Michelle K. Lee
*Deputy Director of the United States Patent and Trademark Office*